United States Patent
Ju et al.

(10) Patent No.: US 8,392,863 B2
(45) Date of Patent: Mar. 5, 2013

(54) METHOD FOR CIRCUIT LAYOUT AND RAPID THERMAL ANNEALING METHOD FOR SEMICONDUCTOR APPARATUS

(75) Inventors: Jianhua Ju, Shanghai (CN); Xian J. Ning, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 311 days.

(21) Appl. No.: 12/877,877

(22) Filed: Sep. 8, 2010

(65) Prior Publication Data
US 2011/0078647 A1 Mar. 31, 2011

(30) Foreign Application Priority Data
Sep. 29, 2009 (CN) .......................... 2009 1 0196892

(51) Int. Cl.
*G06F 17/50* (2006.01)

(52) U.S. Cl. ...................................... 716/122

(58) Field of Classification Search .............. 716/122
See application file for complete search history.

(56) References Cited

U.S. PATENT DOCUMENTS
6,979,618 B2 * 12/2005 Shin .............................. 438/257
7,971,158 B2 * 6/2011 Anderson et al. .............. 716/54

FOREIGN PATENT DOCUMENTS
CN 101454870 A 6/2009

* cited by examiner

*Primary Examiner* — Vuthe Siek
*Assistant Examiner* — Brandon Bowers
(74) *Attorney, Agent, or Firm* — Squire Sanders (US) LLP

(57) ABSTRACT

The present invention provides a design method for circuit layout and a rapid thermal annealing method for a semiconductor apparatus. The design method includes: establishing a ternary relationship among a device electric parameter, an annealing temperature and a distributing density of STI patterns, and establishing a binary relationship between the device electric parameter and a gate pattern length; obtaining a difference between distributing densities of STI patterns in a particular region and in a target region; obtaining an electric parameter difference corresponding to the difference between the distributing densities of STI patterns according to the ternary relationship; obtaining a gate pattern length difference corresponding to the electric parameter difference according to the binary relationship; and adjusting a gate pattern length in the particular region according to the gate pattern length difference. As compared with a traditional design method, the design method for circuit layout provided by the invention does not need adding dummy structure patterns, thereby avoiding negative influence to normal electric performance of the semiconductor apparatus by adding dummy structures.

16 Claims, 4 Drawing Sheets

METHOD FOR CIRCUIT LAYOUT AND RAPID THERMAL ANNEALING METHOD FOR SEMICONDUCTOR APPARATUS

This application claims the benefit of Chinese patent application No. 200910196892.6, titled "Design Method for Circuit Layout and Rapid Thermal Annealing Method for Semiconductor Apparatus" and filed with the Chinese Patent Office on Sep. 29, 2009, which is herein incorporated by reference in its entirety.

FIELD OF THE INVENTION

The present invention relates to the field of semiconductor manufacturing technologies and in particular to a design method for circuit layout and a rapid thermal annealing method for semiconductor apparatuses.

BACKGROUND OF THE INVENTION

General Integrated Circuit (IC) manufacturing technologies include designing a circuit layout as needed, making masks according to the circuit layout, and performing a series of processes including deposition, exposure, etching and annealing by using the masks in order, thereby manufacturing multiple dies arranged on a wafer at the same time. In multi-die products, dies have respective application scenarios and semiconductor structures, therefore their corresponding circuit patterns are different from one another, which may lead to notable non-uniformity of circuit patterns across the effective field of the wafer.

For example, a Radio Frequency (RF) circuit die has a low distributing density of Active Areas (AAs) and a low distributing density of gates, and an embedded memory circuit die has a high distributing density of AAs and a high distributing density of gates. On the other hand, a single die may have regions with different distributing densities of AAs or gates. The difference between distributing densities of semiconductor structures such as AAs and gates may result in a difference between local temperatures of the wafer during Rapid Thermal Annealing (RTA) of the wafer, and further affect uniformity of electric performances of resulting dies across the wafer.

Chinese patent application CN101454870A discloses a method providing uniform temperatures across a limited region of a wafer during a RTA process. The method includes: determining a first reflectivity in a first portion of the limited region by measuring a density of first structures in the first portion. Next, the method determines a second reflectivity in a second portion of the limited region by measuring a density of second structures in the second portion. Specifically, the first structures include diffusion fill shapes and polysilicon conductor fill shapes (non-active dummy structures); and, the second structures include active circuit structures. The first reflectivity and the second reflectivity are then compared. Following this, the method adjusts an amount of overlap between the diffusion fill shapes and the polysilicon conductor fill shapes of the first structures, to balance the first reflectivity and the second reflectivity.

The method described above adds fill shapes to a particular region during circuit layout design, to add dummy structures (dummy gates or dummy AAs) to a die, thereby balancing reflectivities against RTA radiation in regions of the wafer.

However, a problem lies in that dummy structures normally can not be added to some particular regions of some circuits, e.g., under inductors in RF circuits or under Metal-Insulator-Metal (MIM) capacitors, because dummy structures placed in these particular regions may affect electric performances of the circuits.

SUMMARY OF THE INVENTION

A problem solved by the invention is to provide a rapid thermal annealing method to mitigate the temperature uniformity and avoid influence to electric performance of the semiconductor apparatus by adding dummy structures.

A problem solved by the invention is to provide a design method for circuit layout to mitigate the temperature uniformity and avoid influence to electric performance of the semiconductor apparatus by using dummy structures.

In order to solve the problem above, the invention provides a design method for circuit layout, including the steps of:

establishing a ternary relationship among a device electric parameter, an annealing temperature and a distributing density of STI patterns, and establishing a binary relationship between the device electric parameter and a gate pattern length;

obtaining a difference between distributing densities of STI patterns in a particular region and in a target region;

obtaining an electric parameter difference corresponding to the difference between the distributing densities of STI patterns according to the ternary relationship;

obtaining a gate pattern length difference corresponding to the electric parameter difference according to the binary relationship; and adjusting a gate pattern length in the particular region according to the gate pattern length difference.

The step for obtaining a difference between distributing densities of STI patterns in a particular region and in a target region includes the steps of:

obtaining a distributing density of STI patterns in the target region, $D_0$;

obtaining a distributing density of STI patterns in the particular region, $D_x$; and calculating a difference between $D_x$ and $D_0$.

The step for obtaining a distributing density of STI patterns in the target region, $D_0$, includes the steps of:

determining a target electric parameter according to a design requirement of a semiconductor apparatus; and obtaining a distributing density of STI patterns corresponding to the target electric parameter, which is the distributing density of STI patterns in the target region, $D_0$, according to the ternary relationship among the device electric parameter, the annealing temperature and the distributing density of STI patterns.

The step for obtaining a distributing density of STI patterns in the particular region, $D_x$, includes the steps of:

dividing the circuit layout into a plurality of repeating regions;

detecting a distributing density of active areas $A_x$ and a distributing density of gate patterns $P_x$ in each of the regions respectively;

calculating a distributing density of STI patterns in each of the regions according to the equation: $D_x=(1-A_x)\times(1-P_x)$; and judging whether the distributing density of STI patterns in each of the regions equals to the distributing density of STI patterns in the target region; and if not, determining the region as the particular region.

The particular region is a dummy structure-sensitive region.

The electric parameter includes a saturation current or a threshold voltage.

The ternary relationship among the device electric parameter, the annealing temperature, and the distributing density of STI is a linear relationship.

The binary relationship between the device electric parameter and the gate pattern length is a linear relationship.

The invention also provides a rapid thermal annealing method for a semiconductor apparatus, including the steps of:

establishing a ternary relationship among a device electric parameter, an annealing temperature and an distributing density of STI patterns, and establishing a binary relationship between the device electric parameter and a gate pattern length;

obtaining a difference between distributing densities of STI patterns in a particular region and in a target region;

obtaining an electric parameter difference corresponding to the difference between the distributing densities of STI patterns according to the ternary relationship;

obtaining a gate pattern length difference corresponding to the electric parameter difference according to the binary relationship; and adjusting a gate pattern length in the particular region according to the gate pattern length difference;

making a gate in the particular region of the semiconductor apparatus by using an adjusted gate pattern; and obtaining a target annealing temperature corresponding to the distributing density of STI patterns in the particular region according to the ternary relationship, and performing an annealing process with the annealing temperature on the semiconductor apparatus, to achieve a target electric parameter.

The ternary relationship among the device electric parameter, the annealing temperature and the distributing density of STI patterns is a linear relationship.

The technical solution above has the following advantages over the prior art:

The design method for circuit layout uses the distributing density of STI patterns to reflect the distributing densities of AA patterns and Poly-Si patterns, and adjusts the length of gate patterns in the particular region according to the ternary relationship among the distributing density of STI patterns, the device electric parameter and the annealing temperature, and the binary relationship between the device electric parameter and the gate pattern length, thereby making the electric parameter in the particular region close to the target electric parameter and compensating for the non-uniformity in the distribution of STI patterns across the circuit layout. The obtained circuit layout may be used to make a mask, and the mask may further be used to make a semiconductor apparatus, thereby improving temperature uniformity in RTA and obtaining good uniformity of the electric parameter.

As compared with the conventional design method, the design method for circuit layout provided by the invention does not need adding dummy structure patterns, thereby avoiding negative influence to normal electric performance of the semiconductor apparatus by adding dummy structures.

BRIEF DESCRIPTION OF THE DRAWINGS

The foregoing and other objects, features and advantages of the invention will be more apparent from the accompanying drawings, which are not to scale but focus on the major idea of the invention.

DETAILED DESCRIPTION OF THE INVENTION

Figure 1:
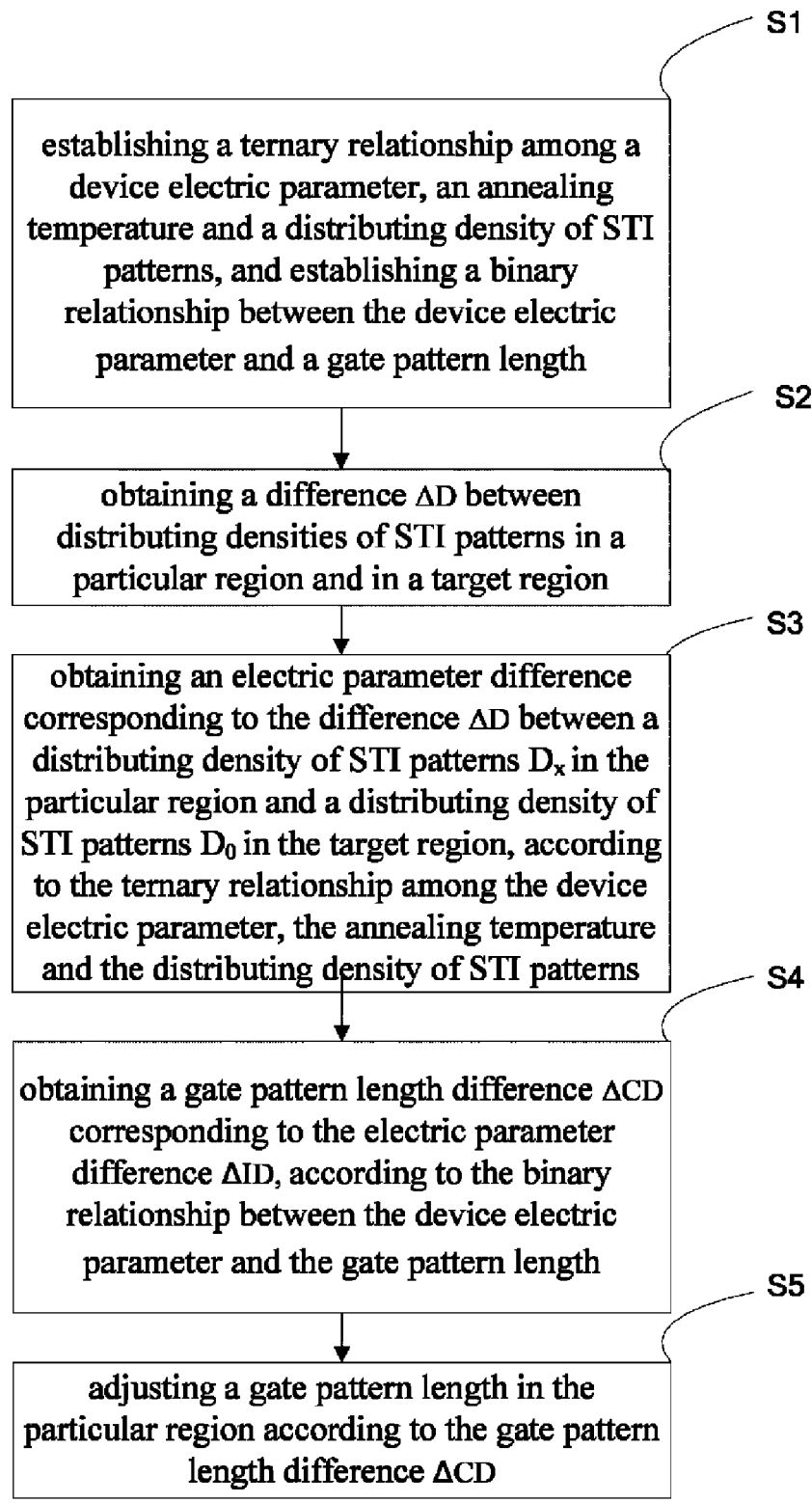
FIG. 1 is a flow chart of a design method for circuit layout according to an embodiment of the invention.

The foregoing and other objects, features and advantages of the invention will be more apparent from the detailed description of the embodiments of the invention in connection with the accompanying drawings.

Numerous design details are described hereinafter for a better understanding of the invention. However, the invention can be implemented in ways other than these described herein, and those skilled in the art can make modifications or alternations without departing from the scope of the invention. Therefore, the invention shall not be limited to the embodiments described below.

In addition, the invention is detailed with reference to the drawings. While describing the embodiments of the invention, sectional views of device structures may be partially enlarged but not necessarily to scale. The drawings are only for illustrative reasons, and shall not limit the scope of the invention. Furthermore, three dimensions including length, width and depth shall be included in practice.

The term "semiconductor apparatus" herein normally refers to multiple IC dies on a wafer. The terms "pattern" or "circuit pattern" herein refer to the layout for making masks that are used in exposure of a series of processes, e.g., a gate pattern, an AA pattern, etc. The term "semiconductor structure" herein refers to a component that actually exists in a semiconductor apparatus, e.g., a gate, an active area, a Shallow Trench Isolation (STI) structure, etc.

In the conventional manufacturing process of an integrated circuit, the non-uniformity in the distribution of circuit patterns may result in temperature non-uniformity during rapid thermal annealing, which may further directly affect electric performance of the semiconductor apparatus in the integrated circuit, making parameters such as voltage threshold and saturation current of a device in a local region fail to meet a target value.

For example, a RF circuit die has a low distributing density of AAs and a low distributing density of gates, and an embedded memory circuit die has a high distributing density of AAs and a high distributing density of gates. On the other hand, a single die may have regions with different distributing densities of AAs or gates. The difference between distributing densities of semiconductor structures such as AAs and gates may result in a difference between local temperatures of the wafer during RTA of the wafer, and further affect uniformity of electric performances of resulting dies across the wafer.

In their studies, the inventors found out that with the heating by high-intensity light sources in RTA (hereinafter referred to as "RTA radiation"), the temperature non-uniformity discussed above is related to absorption and reflection with regard to the RTA radiation by semiconductor structures of the semiconductor apparatus on a wafer. For example, in the RTA of source/drain area thermal activation or metal silicide formation, Active Areas (AAs) and gates (Poly-Si)

normally reflect RTA radiation, and Shallow Trench Isolation (STI) structures normally absorb RTA radiation.

In different semiconductor apparatuses on a wafer, or in the same semiconductor apparatus, semiconductor structures such as active areas, gates and STI structures normally have different distributing densities in different regions, according to product design requirements. Thus, given the same annealing temperature in RTA radiation, the wafer temperature in a region with high distributing densities of AAs and Poly-Si is relatively low due to a high reflectivity; however, the wafer temperature in a region with low distributing densities of AAs and Poly-Si is relatively high due to a high absorbance. Therefore, actual processing temperatures of the semiconductor apparatus across the wafer are uneven, which may further affect activation and diffusion of impurities and result in electric parameter non-uniformity.

The inventors also found out that an objective relationship exists among a distributing density of STI, a device electric parameter of the semiconductor apparatus and an annealing temperature in RTA radiation, and in fact, the distributing density of STI is a complement to the distributing densities of AAs and Poly-Si.

The structure of a semiconductor apparatus depends on the circuit layout pre-designed, therefore, the invention inventively introduces the concept of the distributing density of STI patterns and uses the distributing density of STI patterns to reflect the distributing densities of AA patterns and Poly-Si patterns; adjusts the length of gate patterns in the particular region according to the ternary relationship among the distributing density of STI patterns, the device electric parameter and the annealing temperature, and the binary relationship between the device electric parameter and the gate pattern length, thereby making the electric parameter in the particular region close to the target electric parameter and compensating for the non-uniformity in the distribution of STI patterns; and uses the obtained circuit layout to make a mask and uses the mask to make a semiconductor apparatus, thereby improving temperature uniformity in RTA.

An embodiment of a design method for circuit layout according to the invention is described below with reference to the drawings.

Figure 2:
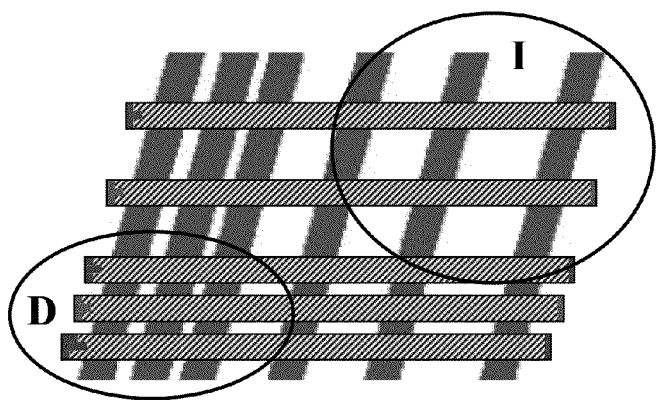
FIG. 2 is a structural diagram illustrating of a part of a semiconductor apparatus according to an embodiment of the invention.
Figure 3:
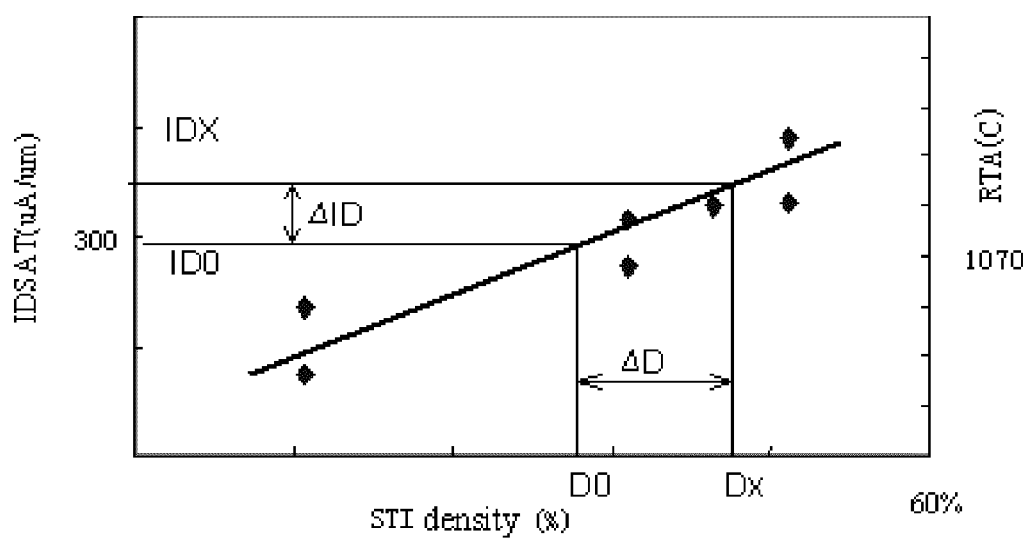
FIG. 3 illustrates a relationship among a saturation current, an annealing temperature and a distributing density of STI patterns according to an embodiment of the invention.
Figure 4:
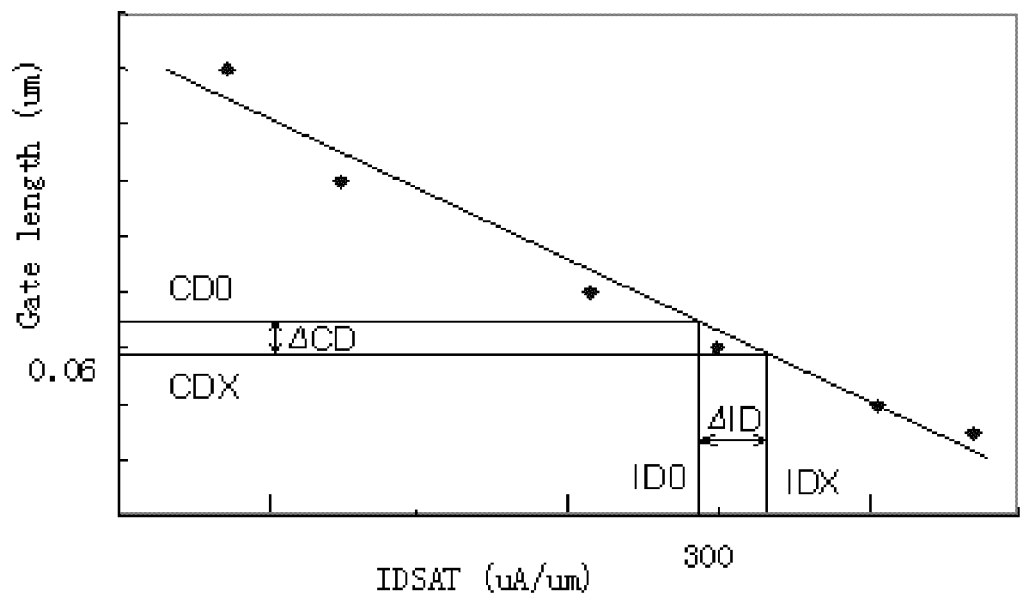
FIG. 4 illustrates a binary relationship between a saturation current and a gate pattern length according to an embodiment of the invention.

FIG. 1 is a flow chart of the design method for circuit layout according to the embodiment; FIG. 2 is a structural diagram illustrating of a part of a semiconductor apparatus in the embodiment; FIG. 3 illustrates a relationship among a saturation current $I_{dsat}$, an annealing temperature and a distributing density of STI in the embodiment; and FIG. 4 illustrates a binary relationship between the saturation current $I_{dsat}$ and a gate pattern length in the embodiment.

As shown in FIG. 1, the design method for circuit layout includes the following steps:

Step S1: A ternary relationship among a device electric parameter, an annealing temperature, and a distributing density of STI patterns, and a binary relationship between the device electric parameter and a gate pattern length are established.

Specifically, as discussed above, the inventors found out that an objective relationship exists among a device electric parameter of the semiconductor apparatus, an annealing temperature and a distributing density of STI. Therefore, a database for the relationship between the electric parameter, the annealing temperature and the distributing density of STI patterns is pre-established, and a graph showing the ternary relationship, e.g., FIG. 3, is constructed according to the database.

As shown in FIG. 3, the inventors found out that a linear ternary relationship exists between a device saturation current $I_{dsat}$, an annealing temperature in RTA radiation and a distributing density of STI patterns of the semiconductor apparatus. A limited number of examples are shown in the graph, with the left vertical axis representing the saturation current $I_{dsat}$, the right vertical axis representing the annealing temperature in RTA radiation, e.g., peak temperature, and the horizontal axis representing the distributing density of STI patterns. The three are in a substantially linear relationship as can be seen from FIG. 3.

In circuit layout design, a target distributing density of STI patterns, $D_0$, is determined according to a desired target saturation current $I_{dsat}$ and the ternary relationship above, then STI patterns and corresponding AA patterns and Poly-Si patterns are designed according to the target distributing density of STI patterns and other design requirements. Theoretically, if a semiconductor apparatus is made according to the obtained circuit layout, and $T_0$, the annealing temperature in RTA radiation (hereinafter referred to as "annealing temperature") corresponding to the target distributing density of STI patterns, $D_0$, is used, the target saturation current value $I_{dsat}$ meeting the design requirements can be achieved.

However, this is only an ideal situation. In practice, semiconductor apparatuses may have different semiconductor structures due to their respective application scenarios. For example, the circuit layout of a CMOS logic circuit or a DRAM circuit normally includes active area patterns, gate patterns and STI patterns. As shown in FIG. 2, solid strips represent active area patterns, shadowed strips with oblique lines represent gate patterns, and the blank regions between them represent STI patterns. The circuit layout of the semiconductor apparatus over the wafer includes: a region I with thinly distributed active area patterns and gate patterns, and a region D with densely distributed active area patterns and gate patterns. Given the same annealing temperature in RTA radiation, the wafer temperature in the region I is relatively low due to a high reflectivity against RTA radiation; however, the wafer temperature in the region D is relatively high due to a high absorbance for RTA radiation. Therefore, actual annealing temperatures of the semiconductor apparatus across the wafer are uneven.

The non-uniformity of annealing temperatures may lead to non-uniformity in activation and diffusion of dopant ions in regions, and further result in electric parameter non-uniformity of the semiconductor apparatus across the wafer. The difference between distributing densities of STI patterns can be compensated by adding dummy structure patterns, to approximately even the actual annealing temperatures of the semiconductor apparatus and improve the uniformity of the electric parameter. However, as discussed in the Background of the Invention, e.g., dummy structures placed under inductors in RF circuits and under Metal-Insulator-Metal capacitors may affect electric performances of the circuits. And those regions may be referred to as dummy structure-sensitive regions.

The embodiment does not need placing such dummy structures, instead, the embodiment adjusts the length of gate patterns to compensate for the non-uniformity of distributing densities of STI patterns. The distributing density of STI patterns is used to reflect the distributing densities of AA patterns and Poly-Si patterns, which is equivalent to using the distributing density of STI patterns, Dx, to express the non-uniformity of actual RTA temperatures of the semiconductor apparatus across the wafer.

Therefore, the distributing densities of STI patterns across the circuit layout is to be obtained, so that a non-uniformity state of STI patterns is detected for reference in subsequent adjustments, i.e., the following step is performed.

Step S2: A difference ΔD between distributing densities of STI patterns in a particular region and in a target region is obtained.

In this step, $D_0$, the distributing density of STI patterns in the target region, is obtained, then $D_x$, the distributing density of STI patterns in the particular region, is obtained, and then the difference of them $(D_x-D_0)$ is calculated.

Specifically, the step of obtaining $D_0$, the distributing density of STI patterns in the target region, includes:

According to design requirements of the semiconductor apparatus, a target electric parameter is determined, then a corresponding distributing density of STI patterns, i.e., the distributing density of STI patterns in the target region, is obtained from the ternary relationship among the electric parameter, the annealing temperature and the distributing density of STI patterns established in step S1. For example, $D_0$, the distributing density of STI in the target region corresponding to the target saturation current $I_{dsat}$, may be read from FIG. 3. In other words, improving the uniformity in the distribution of STI patterns is to make the distributing densities of STI patterns across the circuit layout close to, or even equal to, $D_0$, the distributing density of STI in the target region.

In practice, however, the circuit layout may include not only the target region but also the particular region. The particular region in the embodiment refers to a region with a distributing density of STI patterns different from $D_0$, the distributing density of STI in the target region. Moreover, the particular region can not be added with dummy structure patterns, e.g., the particular region may be a region with RF circuit patterns or MIM capacitor circuit patterns.

Specifically, the step of obtaining $D_x$, the distributing density of STI patterns in the particular region, includes:

The circuit layout is divided into multiple repeating regions in advance, and a distributing density of active area patterns $A_x$ and a distributing density of gate patterns $P_x$ in each of the regions are detected; a distributing density of STI patterns $D_x$ in each of the regions is calculated with the equation: $D_x=(1-A_x)\times(1-P_x)$; and it is judged whether the distributing density of STI patterns in each of the regions equals to the distributing density of STI patterns in the target region, and if not, the region is determined as the particular region and its distributing density of STI patterns $D_x$ is determined as the distributing density of STI patterns $D_x$ in the particular region; if so, the process ends.

Distributing densities of active area patterns, gate patterns and STI patterns determine distributing densities of corresponding active areas, gates and STI structures in the actual semiconductor apparatus. Therefore, the $(1-A_x)$ in the equation above represents a transmittance of active areas with regard to RTA radiation, and the $(1-P_x)$ represents a transmittance of gates with regard to RTA radiation, i.e., the distributing density of STI equals to the product of the transmittance of the active areas with regard to RTA radiation and the transmittance of the gate structures with regard to RTA radiation.

Finally, The difference $\Delta D=(D_x-D_0)$ between $D_x$, the distributing density of STI patterns in the particular region, and $D_0$, the distributing density of STI patterns in the target region, is calculated.

Step S3: An electric parameter difference corresponding to the difference ΔD between $D_x$, the distributing density of STI patterns in the particular region, and $D_0$, the distributing density of STI patterns in the target region is obtained according to the ternary relationship among the device electric parameter, the annealing temperature and the distributing density of STI patterns.

For example, as shown in FIG. 3, ΔID, the electric parameter (i.e., saturation current $I_{dsat}$) difference on the left vertical axis may be obtained from the graph based on the ΔD on the horizontal axis.

Step S4: A gate pattern length difference ΔCD corresponding to the electric parameter difference ΔID is obtained according to the binary relationship between the device electric parameter and the gate pattern length.

For example, as shown in FIG. 4, the inventors found out that a linear binary relationship exists between the device saturation current $I_{dsat}$ and the gate pattern length. A limited number of examples are shown in the graph, with the vertical axis representing the gate pattern length CD, and the horizontal axis representing the saturation current $I_{dsat}$. The two are in a substantially linear relationship as can be seen from FIG. 4. Therefore, the gate pattern length difference ΔCD on the vertical axis may be obtained from the graph base on the ΔID on the horizontal axis.

Figure 5:
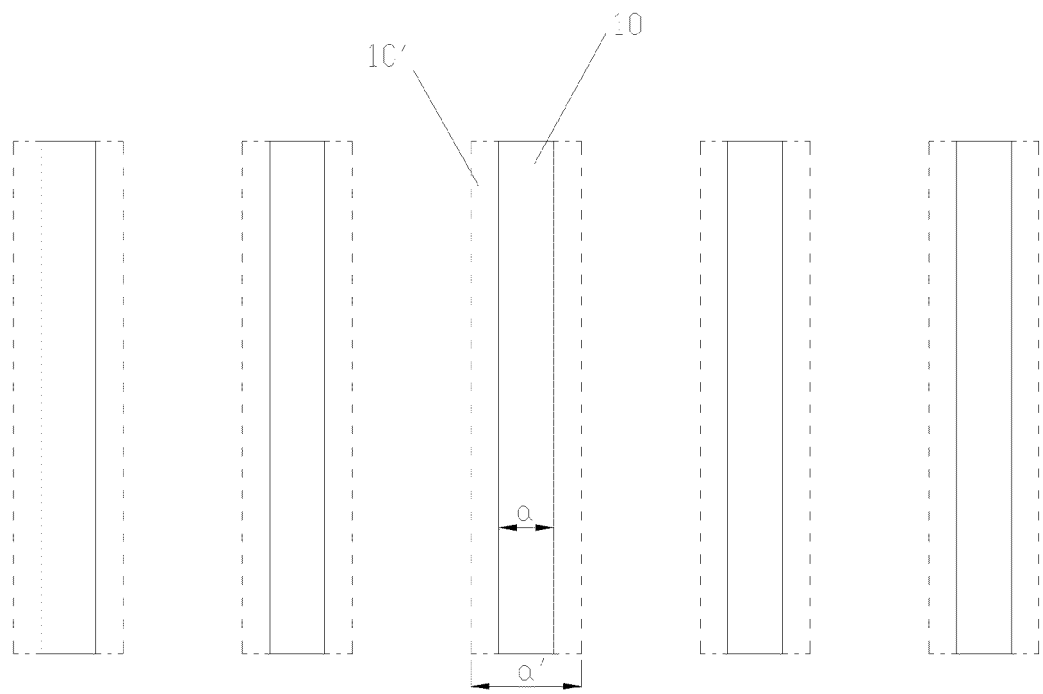
FIG. 5 illustrates a part of a circuit layout according to an embodiment of the invention.

FIG. 5 illustrates a part of a circuit layout according to an embodiment. The circuit layout in FIG. 5 includes multiple strip-shaped gate patterns 10. And the gate patterns 10 have the same size, shape and interval distance. Masks made from the gate patterns 10 may be used to form gates in the wafer in exposure and etching.

Specifically, the gate pattern length is a length in a gate pattern that corresponds to the Critical Dimension (CD) of a gate, determining the length of a channel. For example, in FIG. 5, the length "a" of the short edge of the rectangular gate pattern 10 is the gate pattern length.

Step S5: The gate pattern length of the particular region is adjusted according to the gate pattern length difference ΔCD.

As shown in FIG. 5, solid lines represent gate patterns 10 before adjustment, and dashed lines represent gate patterns 10' after adjustment. It can be seen that the gate pattern length increases from "a" to "a'".

In the embodiment, the curve in FIG. 3 is monotonically increasing, thus $D_x$, the distributing density of STI patterns in the particular region, is larger than $D_0$, the distributing density of STI patterns in the target region, and $ID_x$, the saturation current in the particular region, is larger than $ID_0$, the saturation current in the target region. Further, the curve in FIG. 4 is monotonously decreasing, thus the gate pattern length in the particular region has to be increased correspondingly from the original length, to reduce the excessive saturation current in the particular region, $ID_x$, making it close to $ID_0$, the saturation current in the target region; and vice versa.

The design method for circuit layout discussed above uses the distributing density of STI patterns to reflect the distributing densities of AA patterns and Poly-Si patterns, and adjusts the length of gate patterns in the particular region according to the ternary relationship among the distributing density of STI patterns, the device electric parameter and the annealing temperature, and the binary relationship between the device electric parameter and the gate pattern length, thereby making the electric parameter in the particular region close to the target electric parameter and compensating for the non-uniformity in the distribution of STI patterns across the circuit layout. The obtained circuit layout may be used to make a mask, and the mask may further be used to make a semiconductor apparatus, thereby improving temperature uniformity in RTA and obtaining good uniformity of the electric parameter.

As compared with the conventional design method, the design method for circuit layout provided by the embodiment does not need adding dummy structure patterns, thereby avoiding negative influence to normal electric performance of the semiconductor apparatus by adding dummy structures.

An embodiment of the rapid thermal annealing method for a semiconductor apparatus according to the invention is described below with reference to the drawings.

Figure 6:
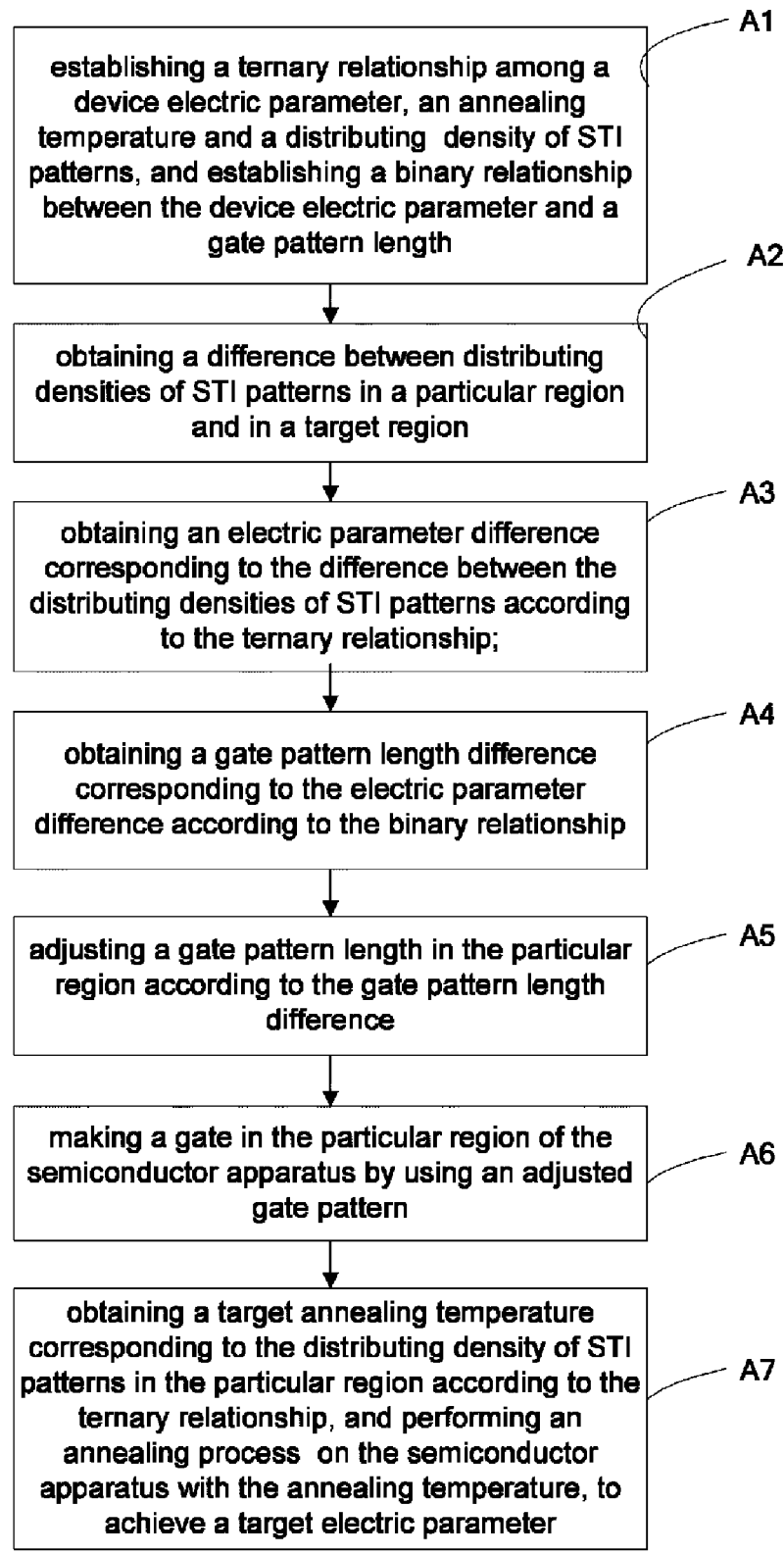
FIG. 6 is a flow chart of a rapid thermal annealing method for a semiconductor apparatus according to an embodiment of the invention.

FIG. 6 is a flow chart of the rapid thermal annealing method for a semiconductor apparatus according to the embodiment.

As shown in the figure, the rapid thermal annealing method for a semiconductor apparatus according to the embodiment includes the following steps:

Step A1: a ternary relationship among a device electric parameter, an annealing temperature and a distributing density of STI patterns is established, and a binary relationship between the device electric parameter and a gate pattern length is established.

Step A2: A difference between distributing densities of STI patterns in a particular region and in a target region is obtained.

Step A3: An electric parameter difference corresponding to the difference between the distributing densities of STI patterns is obtained according to the ternary relationship.

Step A4: A gate pattern length difference corresponding to the electric parameter difference is obtained according to the binary relationship.

Step A5: The gate pattern length in the particular region is adjusted according to the gate pattern length difference.

Step A6: Adjusted gate patterns are used to make gates in the particular region of the semiconductor apparatus. In this step, a mask is first made from the circuit layout including the adjusted gate patterns, then the pattern of the mask is transferred to a photoresist layer or a hard mask layer through exposure, and finally the gates are formed through etching.

Step A7: A target annealing temperature corresponding to the distributing density of STI patterns in the target region is obtained according to the ternary relationship. And an annealing process is performed with the annealing temperature on the semiconductor apparatus, thereby achieving the target electric parameter.

Specifically, the ternary relationship among the device electric parameter, the annealing temperature and the distributing density of STI patterns may be a linear relationship, and the binary relationship between the device electric parameter and the gate pattern length may be a linear relationship.

The RTA method of the embodiment actually is to, upon obtaining the circuit layout by the design method for circuit layout of previous embodiments, to make the semiconductor apparatus using the obtained circuit layout and to perform RTA with the target annealing temperature. Therefore, steps A1 to A5 in the embodiment are similar to those in previous embodiments, and detail descriptions of which are omitted here.

In the RTA method provided by the embodiment, the length of gate patterns in the particular region is adjusted in the layout design stage, so that the electric parameter in the particular region is made close to the target electric parameter and the non-uniformity in the distribution of STI patterns across the circuit layout is compensated. The obtained circuit layout is used to make a mask, and the mask is further used to make a semiconductor apparatus, thereby improving temperature uniformity in RTA, obtaining good uniformity of the electric parameter, and avoiding using dummy structures.

Preferred embodiments of the invention are disclosed above, which shall not limit the scope of the invention in any way. In other embodiments of the invention, the electric parameter may be other electric parameters of a semiconductor apparatus such as threshold voltage, etc. The active area in the embodiments may be, e.g., a source area or a drain area of an MOS device.

The invention is described above in connection with the preferred embodiments, however, the scope of the invention shall not be limited thereto. Those skilled in the art may make many modifications, alternations or equivalents to the invention based on the method above and the technical disclosure herein without departing from the scope of the invention. Therefore, any modifications, alternations or equivalents of the embodiments above in light of the technical substance of the invention without departing from the scope of the invention shall be included in the scope of the invention.

The invention claimed is:

1. A method for manufacturing a semiconductor device, comprising:
    establishing a ternary relationship among a device electric parameter, an annealing temperature and a distributing density of Shallow Trench Isolation (STI) patterns, and establishing a binary relationship between the device electric parameter and a gate pattern length;
    obtaining a difference between distributing densities of STI patterns in a particular region and in a target region;
    obtaining an electric parameter difference corresponding to the difference between the distributing densities of STI patterns according to the ternary relationship;
    obtaining a gate pattern length difference corresponding to the electric parameter difference according to the binary relationship;
    adjusting a gate pattern length in the particular region according to the gate pattern length difference; and
    making a photo mask of gate patterns with the adjusted gate pattern length.

2. The method according to claim 1, wherein the obtaining of a difference between distributing densities of STI patterns in a particular region and in a target region comprises:
    obtaining a distributing density of STI patterns in the target region, $D_0$;
    obtaining a distributing density of STI patterns in the particular region, $D_x$; and
    calculating a difference between $D_x$ and $D_0$.

3. The method according to claim 2, wherein the obtaining of a distributing density of STI patterns in the target region, $D_0$, comprises:
    determining a target electric parameter according to a design requirement of a semiconductor apparatus; and
    obtaining a distributing density of STI patterns corresponding to the target electric parameter, which is the distributing density of STI patterns in the target region, $D_0$, according to the ternary relationship among the device electric parameter, the annealing temperature and the distributing density of STI patterns.

4. The method according to claim 2, wherein the obtaining of a distributing density of STI patterns in the particular region, $D_x$, comprises:
    dividing the circuit layout into a plurality of repeating regions;
    detecting a distributing density of active areas $A_x$ and a distributing density of gate patterns $P_x$ in each of the regions respectively;
    calculating a distributing density of STI patterns in each of the regions according to the equation: $D_x=(1-A_x)\times(1-P_x)$; and
    judging whether the distributing density of STI patterns in each of the regions equals to the distributing density of STI patterns in the target region, and if not, determining the region as the particular region.

5. The method according to claim 1, wherein the particular region is a dummy structure-sensitive region.

6. The method according to claim 1, wherein the electric parameter comprises a saturation current or a threshold voltage.

7. The method according to claim 1, wherein the ternary relationship among the device electric parameter, the annealing temperature, and the distributing density of STI is a linear relationship.

8. The method according to claim 1, wherein the binary relationship between the device electric parameter and the gate pattern length is a linear relationship.

9. A method for manufacturing a semiconductor apparatus, comprising:

establishing a ternary relationship among a device electric parameter, an annealing temperature and a distributing density of Shallow Trench Isolation (STI) patterns, and establishing a binary relationship between the device electric parameter and a gate pattern length;

obtaining a difference between distributing densities of STI patterns in a particular region and in a target region;

obtaining an electric parameter difference corresponding to the difference between the distributing densities of STI patterns according to the ternary relationship;

obtaining a gate pattern length difference corresponding to the electric parameter difference according to the binary relationship; and adjusting a gate pattern length in the particular region according to the gate pattern length difference;

making a gate in the particular region of the semiconductor apparatus by using an adjusted gate pattern; and obtaining a target annealing temperature corresponding to the distributing density of STI patterns in the particular region according to the ternary relationship, and performing an annealing process on the semiconductor apparatus with the annealing temperature, to achieve a target electric parameter.

10. The method according to claim 9, wherein the ternary relationship among the device electric parameter, the annealing temperature and the distributing density of STI patterns is a linear relationship.

11. The method according to claim 9, wherein the obtaining of a difference between distributing densities of STI patterns in a particular region and in a target region comprises:

obtaining a distributing density of STI patterns in the target region, $D_0$;

obtaining a distributing density of STI patterns in the particular region, $D_x$; and calculating a difference between $D_x$ and $D_0$.

12. The method according to claim 11, wherein the obtaining of a distributing density of STI patterns in the target region, $D_0$, comprises:

determining a target electric parameter according to a design requirement of a semiconductor apparatus; and obtaining a distributing density of STI patterns corresponding to the target electric parameter, which is the distributing density of STI patterns in the target region, $D_0$, according to the ternary relationship among the device electric parameter, the annealing temperature and the distributing density of STI patterns.

13. The method according to claim 11, wherein the obtaining of a distributing density of STI patterns in the particular region, $D_x$, comprises:

dividing the circuit layout into a plurality of repeating regions;

detecting a distributing density of active areas $A_x$ and a distributing density of gate patterns $P_x$ in each of the regions respectively;

calculating a distributing density of STI patterns in each of the regions according to the equation: $D_x=(1-A_x)\times(1-P_x)$; and judging whether the distributing density of STI patterns in each of the regions equals to the distributing density of STI patterns in the target region, and if not, determining the region as the particular region.

14. The method according to claim 9, wherein the particular region is a dummy structure-sensitive region.

15. The method according to claim 9, wherein the electric parameter comprises a saturation current or a threshold voltage.

16. The method according to claim 9, wherein the binary relationship between the device electric parameter and the gate pattern length is a linear relationship.

* * * * *